United States Patent
Leung et al.

(10) Patent No.: US 6,714,470 B2
(45) Date of Patent: Mar. 30, 2004

(54) HIGH-SPEED READ-WRITE CIRCUITRY FOR SEMI-CONDUCTOR MEMORY DEVICES

(75) Inventors: Wingyu Leung, Cupertino, CA (US); Jui-Pin Tang, San Jose, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/963,984

(22) Filed: Sep. 25, 2001

(65) Prior Publication Data

US 2002/0015344 A1 Feb. 7, 2002

Related U.S. Application Data

(62) Division of application No. 09/267,228, filed on Mar. 12, 1999.

(51) Int. Cl.[7] .................................................. G11C 7/00
(52) U.S. Cl. .................. 365/203; 365/189.05; 365/206; 365/207
(58) Field of Search ............................. 365/203, 189.05, 365/206, 207, 208

(56) References Cited

U.S. PATENT DOCUMENTS

| | | | | |
|---|---|---|---|---|
| 4,811,300 A | * | 3/1989 | Lanfranca | ................... 365/203 |
| 4,961,166 A | * | 10/1990 | Sato et al. | ............. 365/189.01 |
| 4,984,204 A | * | 1/1991 | Sato et al. | ............. 365/189.11 |
| 5,361,229 A | * | 11/1994 | Chiang et al. | ......... 365/189.05 |
| 6,018,253 A | * | 1/2000 | Wendell | ....................... 326/93 |
| 6,310,808 B1 | * | 10/2001 | Tanizaki | ..................... 365/203 |
| 6,320,806 B1 | * | 11/2001 | Han | ............................ 365/203 |

* cited by examiner

*Primary Examiner*—Son T. Dinh
(74) *Attorney, Agent, or Firm*—Bever, Hoffman & Harms, LLP; E. Eric Hoffman

(57) ABSTRACT

A semi-conductor memory device having a wide write data bandwidth is provided with high speed read-write circuitry having data amplifiers that are activated to accelerate amplification of write data signals being driven by write data drivers onto data lines of the cell array of the device during memory write cycles, as well as activated to amplify read data signals on the data lines during memory read cycles. Moreover, the data amplifiers are activated in a self-timed manner. In one embodiment, the device is further provided with a read data buffer that is constituted with a regenerative latch and an input stage, and a write data buffer having multiple entries. The input stage of the read data buffer isolates or couples the regenerative latch to the data lines depending on whether the data lines are in a pre-charged state or not. In one embodiment, the data amplifiers and the write drivers are further arranged to enable write data in the write buffer to be merged with the masked read data from the memory array when a read transaction hits the write buffer.

11 Claims, 10 Drawing Sheets

HIGH-SPEED READ-WRITE CIRCUITRY FOR SEMI-CONDUCTOR MEMORY DEVICES

BACKGROUND OF THE INVENTION

1. Field of the Invention

The present invention relates to semi-conductor memory. In particular, it relates to read/write circuitry of static and dynamic random access memory (SRAM and DRAM).

2. Background Information

A semi-conductor memory usually includes a number of memory cells (hereinafter simply cells) arranged in a matrix form having rows and columns. Typically, cells of the same row share a common word line, and cells of the same column share a common pair of bit lines (see FIG. 1). In the case of a DRAM device using a folded bit-line structure, cells of the same column are arranged so that the cells are connected alternately to the bit lines. The bit-line pair is in turn connected to a sense amplifier, which is a regenerative latch. The bit-line pair is also connected to a pair of column switches constituted with gates. The gates of the column switches are controlled by a column select signal. Multiple columns are connected together and to a pair of data lines. The data lines in turn are connected to a read data amplifier and a write buffer. The folded bit-line scheme and its variations are well taught in various literature, for examples, "A 55ns 16Mb DRAM, T. Takeshima et al, Digest of ISSCC, February 1989, pp. 246–247", "A 60ns 3.3V 16Mb DRAM, K. Arimoto, et al, Digest of ISSCC, February 1989, pp. 244–245", and U.S. Pat. No. 4,980,862, Foss. In case of a SRAM, the bit-line pair is connected to the column switches before being connected to the sense-amplifier. In this way, multiple columns can share a single sense-amplifier. Such scheme is exemplified by the one described in U.S. Pat. No. 5,357,479, "Static Random Access Memory Capable of Preventing Erroneous Writing, M. Matsui".

In case of a divided bit line architecture, such as the one described in "A 1-Mbit CMOS Dynamic RAM with a Divided Bitline Matix Architecture, R. T. Taylor et al, IEEE JSSCC, vol sc-20, no. 5 October 1985, pp. 894–902", the cells are connected to segment-lines. Multiple pairs of segment lines in turn are connected to a pair of bit lines through segment switches. In these schemes, the bit-line pair and data-line pair carry complementary signals during read or write operations to increase the signal-to-noise ratio. The data lines form the communication links between the cell array and the I/O circuits of the DRAM. In other schemes, multiple memory arrays are connected in parallel to the data lines, and the data lines form a data bus connecting the cell arrays to the I/O circuits of the memory device.

The bit lines, in general, have relatively large capacitive loading because of cell multiplexing. To conserve die area, a bi-stable sense-amplifier consists of a cross-coupled pair of PMOS transistors and a cross-coupled pair of NMOS transistors are usually employed. The sources of the NMOS cross-coupled pair are connected to the drain of yet another NMOS transistor with its source coupled to ground. The gate of this other NMOS transistor is controlled by a N_Sense_Enable signal San. Similarly, the sources of the PMOS cross-coupled pair are connected to the drain of yet another PMOS transistor with its source coupled to VCC. The gate of this other PMOS transistor is controlled by P_sense_Enable signal $SA_p$. The P_Sense_Enable and N_Sense_Enable signals are used to control the turn-on of the sense amplifier. The bit lines are both input and output signals of the sense-amplifier.

In the case of DRAM, the regenerative sense-amplifier accomplishes data restoration as well as signal amplification. Due to the relatively weak cell signal, the small device size of the amplifier limited by the small area in the tight-pitch column area, and the large bit line capacitance, bit-line sensing is relatively slow. Another reason for the slow sensing is because of the large number of sense-amplifiers getting turned on simultaneously during bit-line sensing. This causes large amount of current flow through the on-chip power lines to the sense-amplifiers, creating large power spikes that can degrade the signal-to-noise ratio during the sensing operation. In order to reduce the power spike, sense amplifiers with multi-step turn on is used to limit the peak current going through the sense amplifiers. An example of multi-step sensing is described in U.S. Pat. No. 4,370,575 "High Performance Dynamic Sense Amplifier with Active Loads", McAlexander, III et al. In a multi-step sensing scheme, the sense-amp turn-on transistors are divided into multiple transistors with their gates controlled by signals which are activated one after the other, so as to limit the peak current during sense-amp turn on. However, the multi-stage turn on lengthens the sensing time and thus the read and write time.

The data lines also have large capacitive loading due to the column multiplexing and, in some cases, array multiplexing. Data line signal rise and fall time is relatively long. In the cases where a static comparator is used for data amplification, such as the one described in "A 1-Mbit CMOS Dynamic RAM with a Divided Bitline Matrix Architecture, R. T. Taylor at al, IEEE JSSC, vol. sc-20, no. 5, pp 894-902, October 1985", the data-line pairs are pulled high by a pair of PMOS devices. During operation, the sense-amplifier is turned on so that signal development in the bit-lines are well established before the column switches are turned on. This requires the sense-amplifier to be turned on much earlier than the column switches so that voltage differential on the outputs of the sense-amplifier is big enough to withstand the disturbance caused by the turn-on of the column switches. In a prior art scheme described in "A 20-ns 128-kbit×4 High-Speed DRAM with 330-Mbit/s Data Rate, N. C. C. Lu at el, IEEE JSSC, vol. 23 no. 5, October 1988, pp. 1140-1148", a two-stage regenerative data-amplifier (I/O sensing amplifier) is used to amplify signals from the column switches during data read operations to speed up the data restore operation in the sense-amplifier. [The reference was silent with respect to usage of data-amplifier for data write operations.]

Furthermore, traditional write driver circuit is separated from the data amplifier circuit so as to simplify the control during write operations. Due to the relatively large capacitance in the data lines, the write driver takes up relatively large area. The area is not a significant problem for memory devices with few data lines. However, for a memory device that requires wide write bandwidth with many bits of data being written simultaneously to the cell array, the amount of die area consumed by the write driver has become a significant issue. This is especially true for the new generation of memory devices where it will not be uncommon to write a hundred or more bits of data to the cell array at the same time.

Thus, a faster operating read-write circuitry, without the disadvantages of the prior art, for memory devices with a relatively wide write bandwidth, is desired.

SUMMARY OF THE INVENTION

A semi-conductor memory device having a wide write data bandwidth is provided with high speed read-write circuitry having data amplifiers that are activated to accelerate amplification of write data signals being driven by write data drivers onto data lines of the cell array of the device during memory write cycles, as well as activated to amplify read data signals on the data lines during memory read cycles. Moreover, the data amplifiers are activated in a self-timed manner. In one embodiment, the device is further provided with a read data buffer that is constituted with a regenerative latch and an input stage, and a write data buffer having multiple entries. The input stage of the read data buffer isolates or couples the regenerative latch to the data lines depending on whether the data lines are in a precharged state or not. In one embodiment, the device is further provided with a post-write buffer which allows write data of the present write transaction to be stored while the write data of the previous transaction is retired to the memory array. With the write data to be retired readily available, the retiring process can be started at the beginning of the memory cycle, thereby improving the write speed of the memory device as a whole. In one embodiment, the data amplifiers and the write drivers are further arranged to enable write data in the write buffer to be merged with the masked read data from the memory array when a read transaction hits the write buffer.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

The present invention will be described in detail in the context of one embodiment of an SRAM compatible device. In the description to follow, various aspects of the present invention will be described. To facilitate thorough understanding, specific numbers, materials and configurations will be set forth for selected elements. However, in other instances, well known features are omitted or simplified in order not to obscure the present invention. Those skilled in the art will appreciate that the present invention may be practiced with only some or all aspects of details described.

Figure 2:
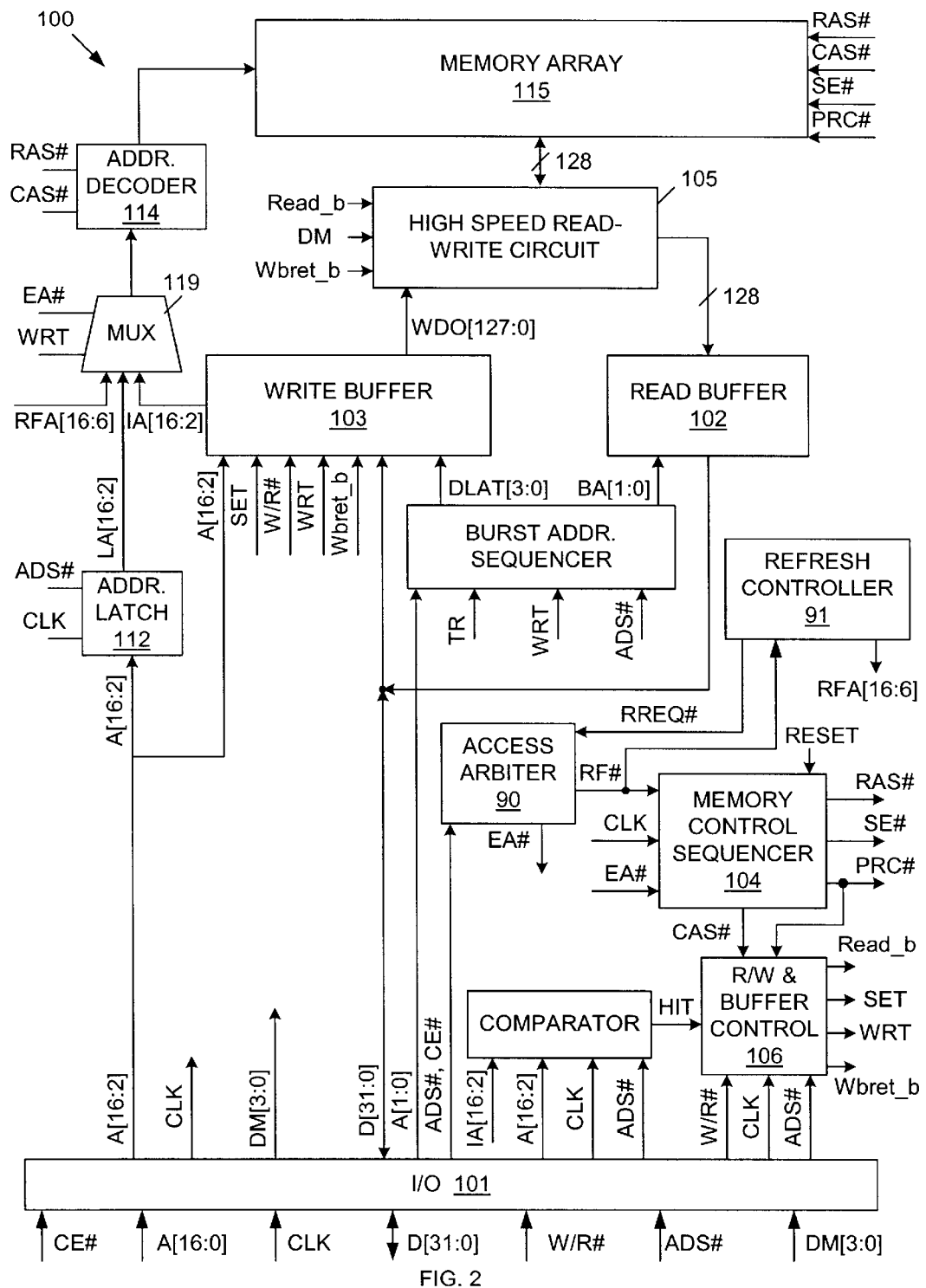
FIG. 2 illustrates a semi-conductor memory device incorporated with the teachings of the present invention in accordance with one embodiment.

FIG. 2 illustrates an example SRAM compatible memory device incorporated with the high speed read-write circuitry of the present invention, in accordance with one embodiment. For the illustrated embodiment, SRAM compatible memory device 100 includes read-write circuit 105, read and write buffers 102 and 103, and R/W-Buffer Control 106 incorporated with the teachings of the present invention. Additionally, memory device 100 includes memory array 115, I/O interface 101, memory control sequencer 104, refresh controller 91, access arbiter 90, and so forth. These elements are coupled to each other as shown.

As will be described in more detail below, read-write circuit 105 includes data amplifiers, write data drivers and a timing control circuit, organized and cooperating with each other in a novel manner to overcome the disadvantages of wide write data bandwidth semi-conductor memory devices constituted in accordance with prior art. For the illustrated embodiment, memory array 115 is divided into 16 banks of 128 rows and 2048 columns. 115 is divided into 16 banks of 128 rows and 2048 columns. I/O interface 101 performs its conventional function of buffering between internal and external signals. Refresh controller 91, access arbiter 90 and other aspects of this organization are described in detail in commonly owned U.S. Pat. No. 6,028,804, by Leung, entitled "Method and Apparatus For 1-T SRAM Compatible Memory". Memory control sequencer 104 is described in detail in commonly owed U.S. Pat. No. 6,078,547, by Leung, entitled "Method and Structure for Controlling Operation of a DRAN Array". Except for the teachings of the present invention, read and write buffers 102 and 103 are generally described in U.S. Pat. No. 6,075,740, by Leung, and entitled "Method and Apparatus for Increasing the Time Available for Refresh for 1-T SRAM Compatible Devices". The above-enumerated patents are hereby fully incorporated by reference. Nevertheless, an overview description will be given below.

An external access begins when chip enable CE# and address strobe ADS# are detected low at the rising clock edge. The state of the signal write/read enable W/R# is also evaluated. When detected low, a read access is performed. When detected high, a write access is carried out. Read and write data D[31:0] are communicated to or from the outside world through a bidirectional bus. A write mask is also received via signals DM[3:0] for byte level masking. Synchronization of communication between the device and the accessing agent (or agents) is facilitated by clock signal CLK. Refresh controller 91 incorporates a timer which generates a refresh request approximately every 8us. Refresh request signal RREQ# is activated when there is a pending refresh. Access arbiter 90 arbitrates access of array 115 between external read/write and internal refresh request. When an external access transaction is detected, access arbiter 90 drives signal EA# low, causing a memory cycle to be carried out using the address supplied externally on address signals A[16:2]. An internal refresh is carried out in a clock cycle when there is no external transaction detected and a refresh request is pending. That is when signal EA# is high and signal RREQ# is low. Address multiplexer 119 passes the row address via signals RFA[16:6] for refresh. The memory array operation is controlled by memory control sequencer 104 using signals: row access strobe RAS#, sense-amp enable SE#, column switch enable CAS#, and precharge PRC#.

Read buffer 102 contains 4 words of 32 bits. Posted write buffer 103 contains two entries (also referred to as input and output entry respectively), with each entry containing 4 words of 32-bit data, a 17-bit address and 4 words of 4-bit write data-masks. The burst length of a transaction varies between one to four words of 32 bits. During a write transaction, data and data-mask of the whole transaction are written to the same entry of write buffer 103. Address of the transaction is also written to the address field of the same entry. The data is not retired to memory array 115 until the beginning of next write transaction. The two entries of write buffer 103 work in a First-In-First-Out fashion. Data is written to the input entry, and retired from the output entry. The input entry is isolated from the output entry during data retiring, otherwise input of the output entry receives data from the input entry. When a new write transaction is detected, address of write buffer entry to be retired is driven on the internal address bus via signals IA[16:2] and selected by the address multiplexer 119 to access memory array 115. Up to 128 bits of data are retired to memory array 115 simultaneously. The read and write operations are effectuated by read-write circuit 105 responsive to read and write retire control signals read_b and wbret_b generated by R/W & buffer control 106.

In accordance with the present invention, to be described more fully below, a write operation is advantageously started as soon as a write transaction is detected, since the data to be written to memory array 115 are already available on chip. More specifically, write data are driven to memory array 115 without waiting for the I/O operations, and a memory cycle is completed without waiting for external data. As those skilled in the art will appreciate, this is different from traditional DRAM devices in which a memory cycle is not completed until the last piece of write data is driven in to the memory array from the I/O. The high-speed read write circuitry of the present invention is designed to effectuate this advantageous manner of operation.

During a read transaction, four words of 32 bits are fetched simultaneously from array 115 to read buffer 102. All or part of the four words are supplied as data for the read transaction, which may have a burst length varying from one to four words. As will be readily apparent from the descriptions to follow, the high speed read-write circuitry of the present invention advantageously overcome the stringent restriction otherwise imposed on the physical layout area for the data amplifiers and write drivers of read-write circuit 105 by the relatively large number of data bits being concurrently transferred. [Traditional DRAM typically transfers 8 or 16 bits.]

Figure 3:
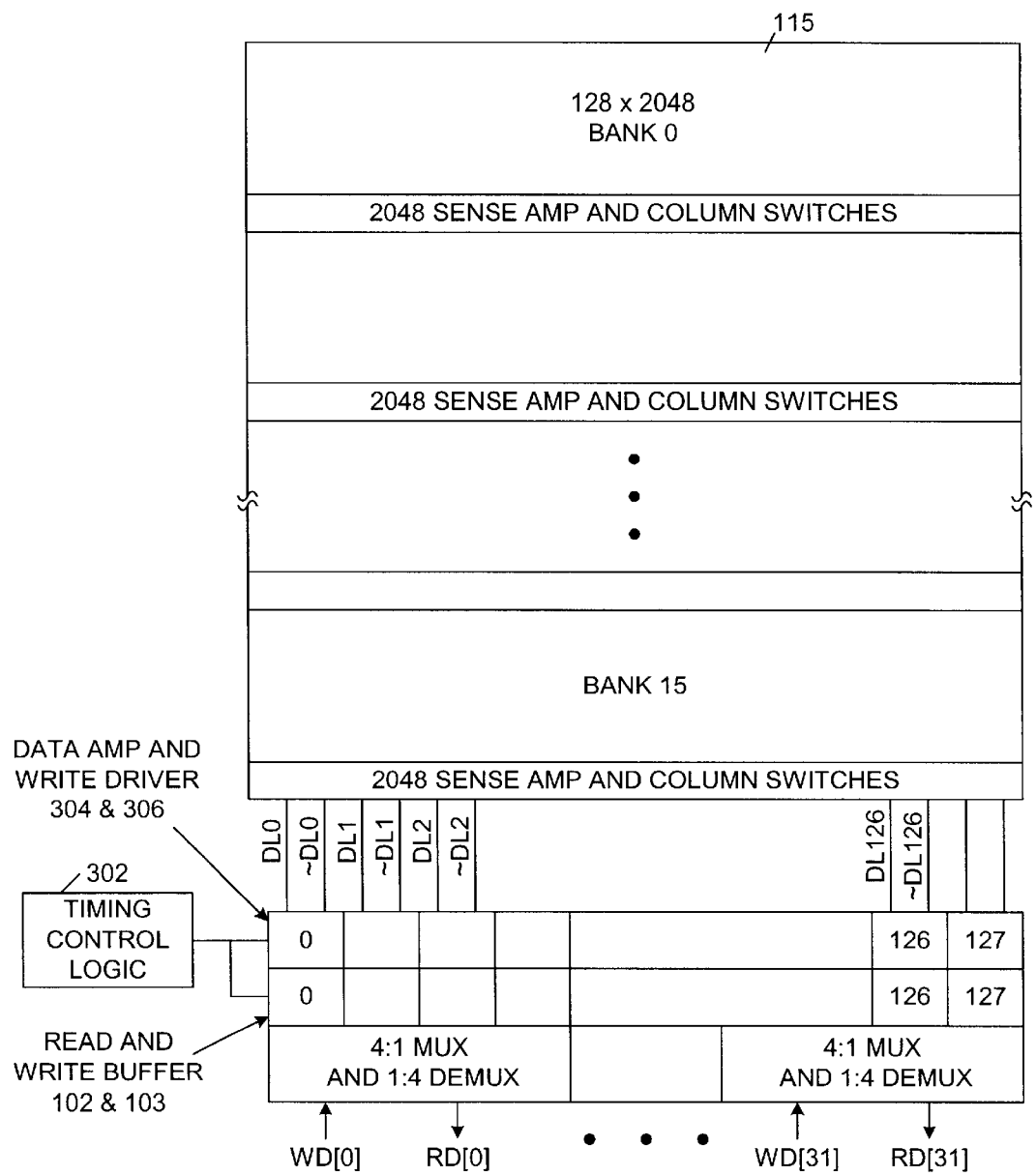
FIG. 3 illustrates the organization for the memory cells, the data amplifiers, the write drivers, the timing control circuit and the read-write buffers in further details in accordance with one embodiment.

FIG. 3 illustrates the organization of memory array 115, read-write circuit 105 and data buffers 102–103 in further details, in accordance with one embodiment. As described earlier, read-write circuit 105 includes data amplifiers 304, write drivers 306 and timing control logic 302, whereas memory array 115 is organized as 16 banks of 128 rows by 2048 columns. Moreover, array 115 uses a column structure similar to the one shown in FIG. 1. That is, associated with each column is a sense-amplifier and a pair of column switches. The column switches connect the bit lines BLn and ⁻BLn to the data lines DLp and ⁻DLp. Sixteen columns or bit-line pairs are multiplexed to one pair of data lines. Each data-line pair connects the corresponding sixteen columns in parallel to read-write circuit 105 of the present invention. In other words, the data line pairs from a bi-directional bus connecting between read-write circuit 105 and the columns of the memory banks. Since each pair of data lines connect to 256 (16 columns ×16 banks) columns switches, capacitive loading on the data lines is relatively heavy (~2–3pf). This together with the bit line capacitance present a heavy loading on the relatively small sense amplifier when the corresponding column switches are turned on. Using a traditional static comparator, line the one described in "A 1-Mbit CMOS Dynamic RAM with a Divided Bitline Matrix Architecture, R. T. Taylor, IEEE JSSC vol. sc-20, no. 5, October 1985, pp. 894–902", for data line signal amplification requires the sense amplifier to drive the data lines and bit lines substantially to VCC and ground level by itself during data restore. The large capacitance loading on the bit lines and data lines in turn slows down the data restore speed. In addition, before column switches are turned on, signal differential on the bit lines as to reach a substantial voltage or the heavy loading and the imbalance on the data lines can reduce the signal differential on the bit lines to a level smaller than the sense-amplifier can resolved when the column switches connect the bit lines to the data lines. Likewise, during write operation, a relatively large write driver would have been required to overcome the loading on the data lines under the prior art. In aggregate, 128 of these large write drivers would have presented a significant area consumption problem. However, as a result of the novel manner in which read-write circuit 105 is constituted and operated, a smaller write driver may be used. In turn, for the illustrated embodiment, each bit-slice "collection" of data amplifier 304, write driver 306 and the data latches of read-write data buffers 102–103 may be laid out with a pitch matching the width dimension of the 16 columns which read-write circuit 105 connects.

Figure 4:
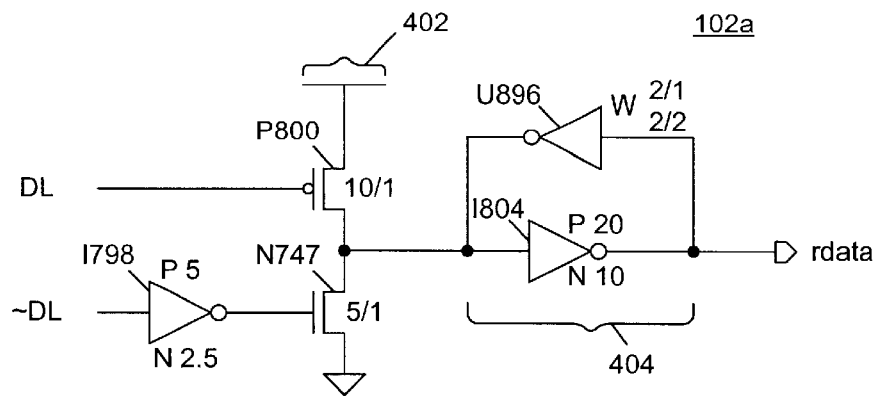
FIGS. 4–5 illustrate a bit slice of the read and write buffers respectively in accordance with one embodiment.
Figure 5:
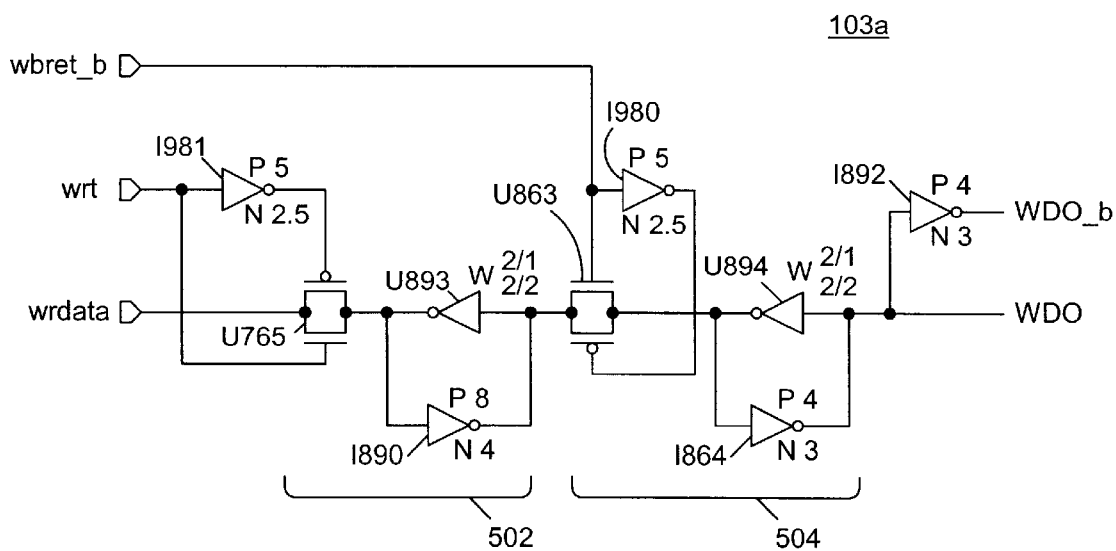
Figure 6:
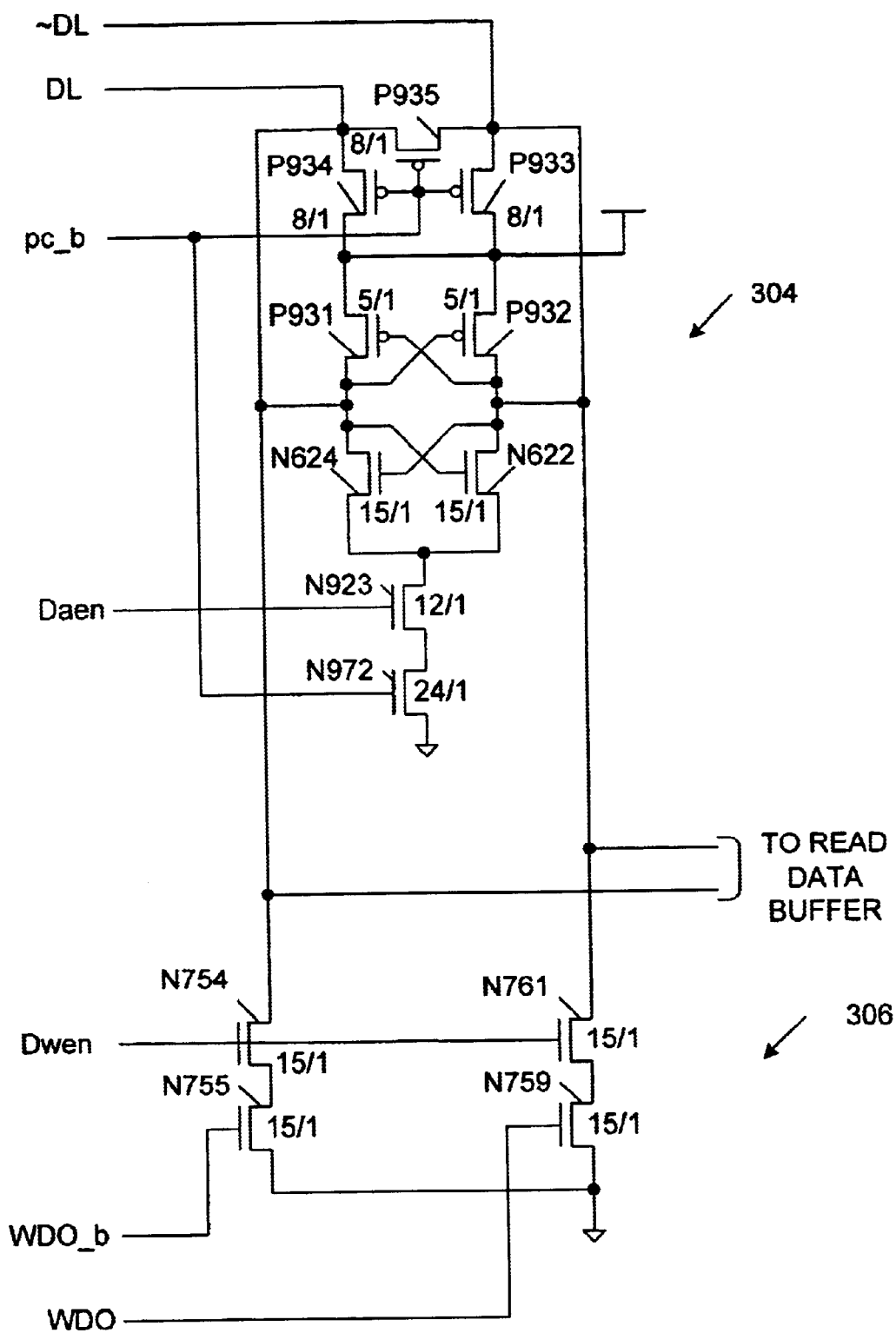
FIG. 6 illustrates a data amplifier and a write data driver respectively in accordance with one embodiment.

FIGS. 4–7 illustrate the schematic for read and write buffers 102–103, data amplifier 304, write driver 306 and time control 302 of read-write circuit 105, in accordance with one embodiment. More specifically, FIGS. 4–6 are bit-slice views of read and write buffers 102–103, data amplifier 304 and write driver 306. As shown in FIG. 4, for each bit, read data buffer 102 includes input stage 402 and regenerative latch 404. Input stage 402 is constituted with transistors P800 and N747, whereas regenerative latch 404 is constituted with inverters I804 and U896. As described in the above incorporated by reference applications, data lines DI and ⁻DI are pre-charged. The pre-charged high state of data lines DI and ⁻DI causes transistors P800 and N747 of input stage 402 to turn off, thereby isolating inverters I804 and U896 of regenerative latch 404, and thus putting it in the latching state. When differential signals are present on data lines DI and ⁻DI, transistors P800 and N747 of input stage 402 are turned on depending on the state of DI and ⁻DI, coupling inverters I804 and U896 of regenerative latch 404 to data lines DI and ⁻DI to receive read data signals for read data buffer 102. In other words, under the present invention, read data buffer 102 operates responsive to the voltage state of data lines DI and ⁻DI, without the need of a conventional control signal.

In the case of write buffer 103, as shown in FIG. 5, it includes two cascaded buffer slots 502 and 504 for storing two entries of write data, with slots 502 and 504 being the input and output slots for storing an input and an output entry respectively. For each bit, input slot 502 is formed by transmission gate U765, and inverters U893 and I897, whereas output slot 504 is formed by transmission gate U863, and inverters U894 and I864. Input slot 502 receives input data from signal wrdata when the write control signal wrt is activated high. Output slot 504 receives data from input slot 502 when the write-buffer retire signal Wbret_b is deactivated high.

As illustrated in FIG. 6, data amplifier 304 is a regenerative amplifier formed with a number of transistors coupled to each other, to the corresponding data line pair DI and ⁻DI, and timing control 302. As will be described in more details below, in accordance with the present invention, data amplifier 304 is advantageously activated for a write operation as well as for a read operation. As shown, data amplifier 304 is activated by data amplifier enable signal Daen. When data amplifier 304 is not activated, data lines DI and ⁻DI are equalized by transistor P935 and precharged to VCC by P-channel transistors P933 and P934. When activated during read memory cycles, it amplifies read data signals on data lines DI and ⁻DI, whereas when activated during write memory cycles, it accelerates amplification of write data signals being driven onto DI and ⁻DI by write driver 306, thereby reducing the power and therefore the size of write driver 306.

Write driver 306 is formed with a pair of write enabling transistors N754 and N761, and pull-down driving transistors N755 and N759. Data inputs of write driver 306 are connected to the corresponding complementary outputs of the write data buffer 103. Before write driver 306 is activated, both DI and ⁻DI are at a voltage close to VCC potential. When activated, one of the stack transistor pairs N754–N755 and N759–N761 is turned on to pull the corresponding data line to ground activating the cross coupled PMOS transistors P931 and P932, thereby driving the other data line to VCC. The data mask signal dm (FIG. 7), when activated high, puts write driver 306 in the high-impedance state during the memory write cycle, thereby facilitating write data masking.

Figure 7:
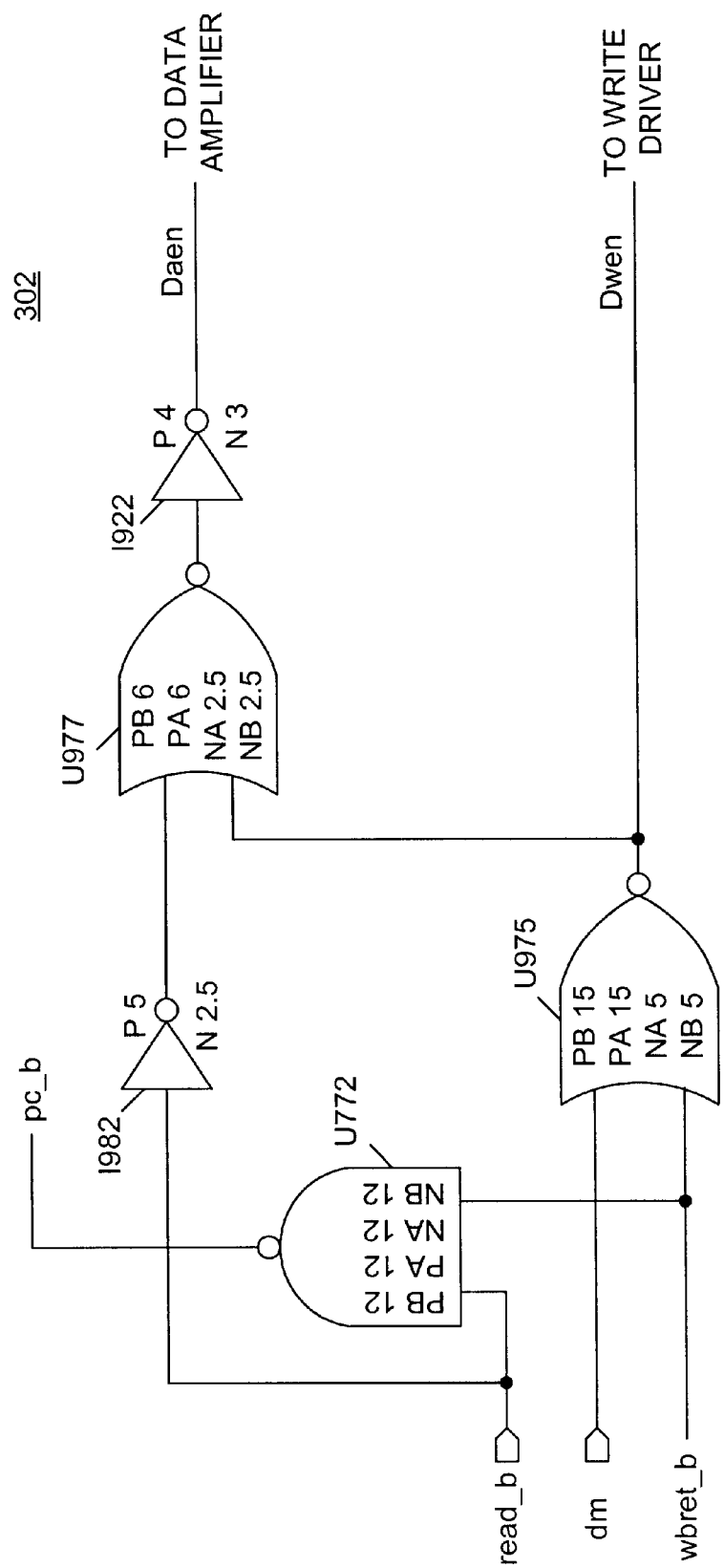
FIG. 7 illustrates the timing control circuit in accordance with one embodiment.

As illustrated in FIG. 7, timing control logic 302 consists of NAND gate U772, inverters I982, I922, and NOR gates U975 and U977. Timing control logic 302 takes the input signals read enable read_b, write retire wbret_b and data mask dm, and generates data amplifier control signal Daen, data amplifier pre-charge signal Pc_b, and data write enable signal Dwen, for data amplifier 304 and write data driver 306, using gate delays in a self-timed fashion. Timing control logic 302 generates Daen for data amplifier 304 during memory write as well as memory read cycles. However, by virtue of Daen and Dwen's indirect and direct dependency on dm, only data amplifiers 304 and write data drivers 306 corresponding to the non-masked data bits are turned on.

Figure 8:
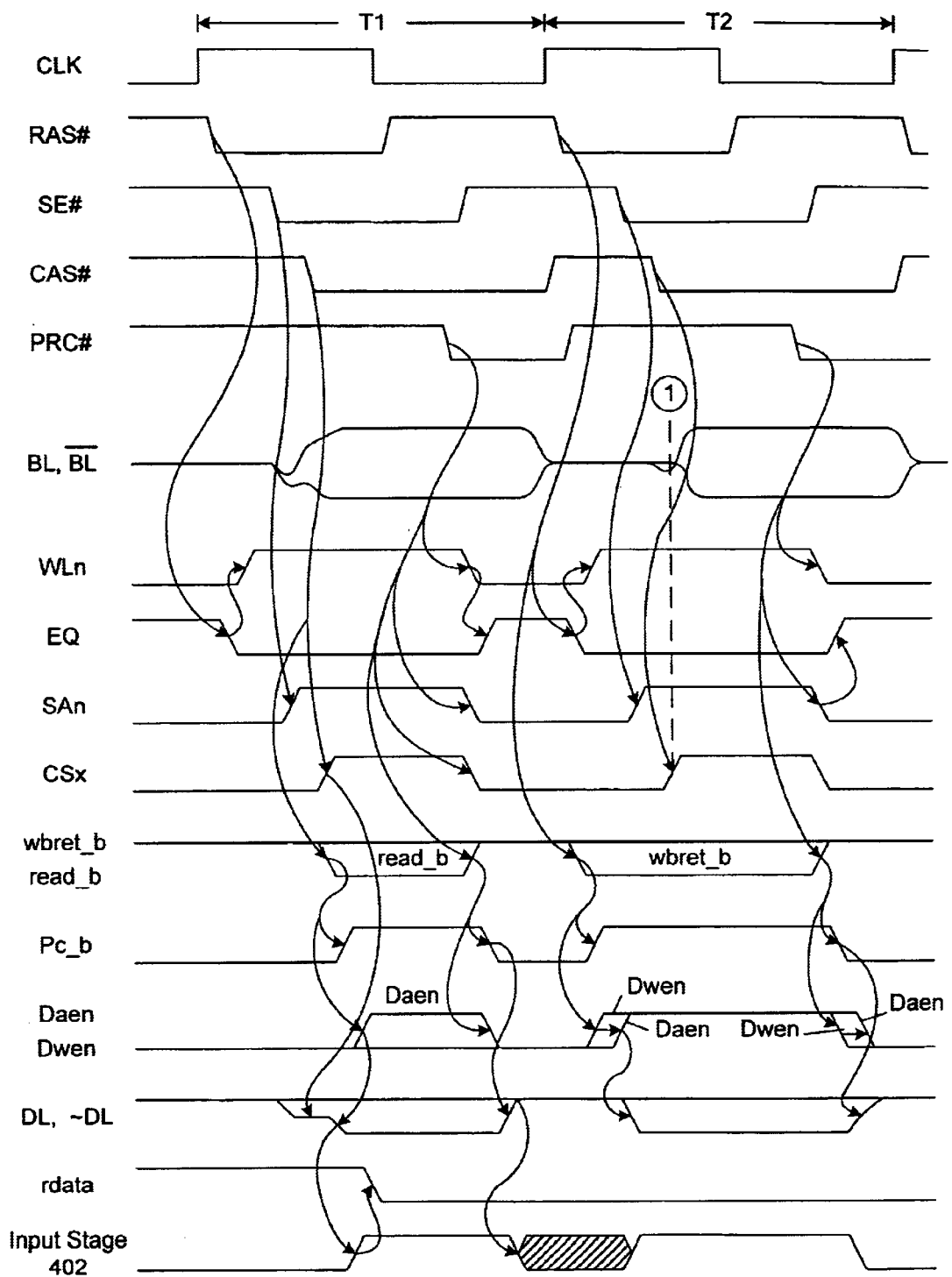
FIG. 8 is a timing diagram illustrating timing of selected signals under the present invention in accordance with one embodiment.
Figure 9:
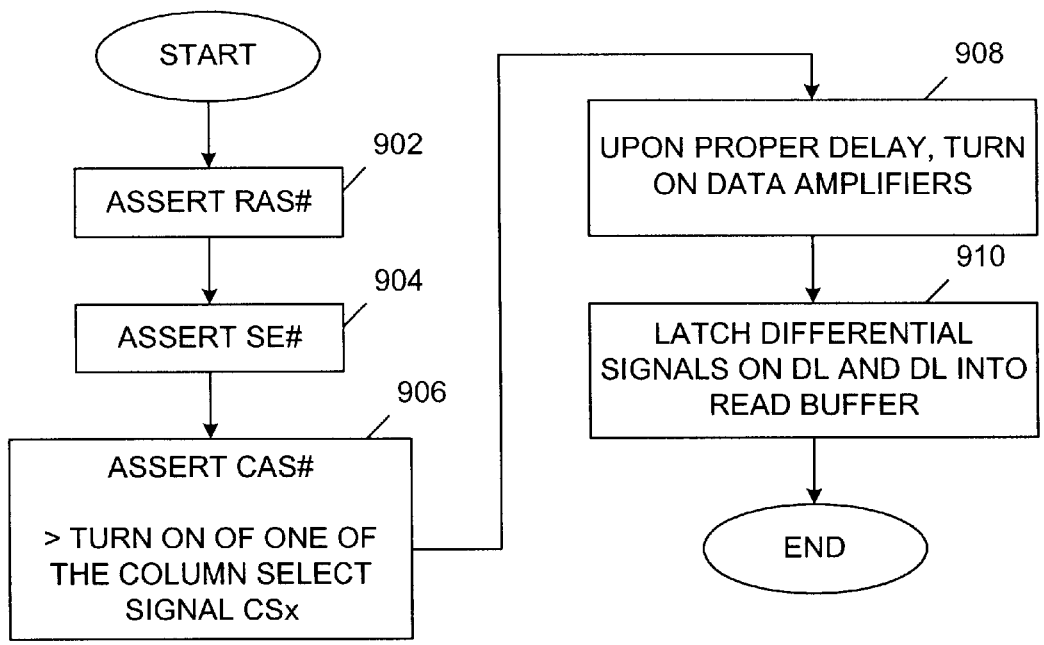
FIGS. 9–10 illustrate a method each for reading and writing data from and to the memory array respectively, in accordance with one embodiment.
Figure 10:
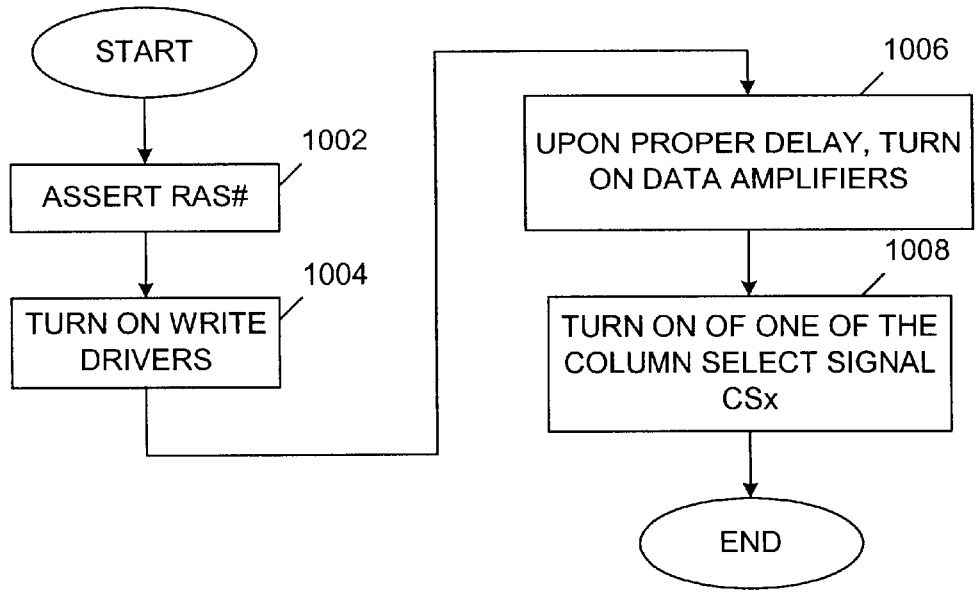

FIGS. 8–10 illustrate memory read and write operations under the present invention, using the high speed read-write circuitry of the present invention described earlier, in accordance with one embodiment. More specifically, FIG. 8 is a timing diagram showing the timing of selected signals of memory array 115 and of read-write circuit 105 (FIG. 2), and FIGS. 9–10 illustrate selected operations performed during read and write memory cycles respectively. The electronic elements referenced in the description to follow are illustrated in the earlier described FIGS. 4–7.

As illustrated in FIG. 8, at the start of a memory cycle, signal ADS# is detected low, e.g. at the beginning of clock cycles T1 and T2. At the rising edge of the clock in T1, the external read access is detected. In response, the memory control sequencer asserts signal RAS# (block 902 of FIG. 9), which causes the deassertion of the bit-line equalization signal EQ and the enabling of row address decoding, resulting in the assertion of the word line WIn selected by the row address. Next, signal SE# is asserted (block 904, of FIG. 9), causing the assertion of the sense-amplifier enable signals SAn and SAp and the bit-line signal amplification to start. This is followed by the assertion of the CAS# signal (block 906 of FIG. 9), leading to the turn-on of one of the column select signal CSx, connecting column x to the corresponding data line pair DI and ⁻DI. The assertion of the CAS# signal also causes signal read_b to be asserted low which in turn causes the deactivation high of signal Pc_b, thereby disabling the equalization transistor P935 and pre-charge transistors P933 and P934 of the data amplifier (FIG. 6). Next, the data amplifier is activated (block 908 of FIG. 9). The activation of the data amplifier is delayed as the assertion high of the signal Daen is delayed by the inverter I982, NOR gate U977 and inverter I922 of the timing control circuit (FIG. 7). The arrangement of these three logic gates together with the stack connection of the transistors N923 and N972 of the data amplifier (FIG. 6) facilitate slow turn on and fast turn off on the data-amplifier. The slow turn-on allows sufficient signal development on the data lines before the data-amplifier is turned on, thereby ensuring correct data amplification. The fast turn-off allows DI and ⁻DI to be precharged sooner. This is made possible by the arrangement of the read buffer latch of FIG. 4. (Recall that data is automatically latched into read buffer 102a when one of the data lines DI or ⁻DI goes low.) When the data amplifier is activated, the regenerative configuration of the data amplifier helps the bit-line sense-amplifier in amplifying signals not only on the data lines but also the bit lines, thereby speeds up data restoration on the bit lines. The balance loading on the pre-charged data lines allows the column switches to be turned on even when the differential signal on BI and ⁻BI is still not substantially developed without causing data sense error. The differential signal at DI and ⁻DI is then buffered and converted to single-ended signal by the input stage of the read data buffer (FIG. 4, and block 910 of FIG. 9).

Furthermore, when DI is high and ⁻DI is low, P-channel transistor P800 of the read data buffer (FIG. 4) is turned off and N-channel transistor N747 of the read data buffer (FIG. 4) is turned on. Transistor N747 drives the input of the regenerative latch of the read data buffer formed by inverters I804 and U896 (FIG. 4) to ground and read data of '1' appears on the output signal rdata. Similarly, when DI is low and ⁻DI is high, N-channel transistor N747 is turned off and transistor P800 is turned on pulling input of the regenerative latch high and causing a read data of '0' to appear on signal rdata. Next, signal PRC# is asserted low, causing the deactivation of the signals word line WIn, column switch CSx, sense-ampliffier enable SAn and SAp, and read control Read_b. After Win is deactivated, signal EQ is activated to start the bit-line equalization. Also, the deactivation of Read_b causes the deassertion of the Daen signal and the activation of the Pc_b signal. As a result, the data amplifier is deactivated, and the data lines are equalized and pre-charged. The former one is accomplished by the turning off of transistor N972 of the data amplifier first, then followed by N923 of the data amplifier (FIG. 6). The data lines equalization is accomplished by the turning on of transistor P935 of the data amplifier, and data line pre-charge is accomplished by the turning on of transistors P933 and P934 of the data amplifier (FIG. 6). The pre-charge high of signals DI and ⁻DI turns off the transistors P800 and N747 of the read data latch (FIG. 4) and puts the read data latch in the latching state.

Also illustrated in FIG. 8, a memory write cycle starts at the beginning of clock cycle T2 with the activation of signal RAS# (block 1002 of FIG. 10), causing the deactivation of the bit-line equalization signal EQ and the enabling of row address decoding. This results in the assertion of the word line WIn selected by the row address. The activation of RAS# also activates the write-buffer retiring signal Wbret_b. Assuming the data mask signal dm is low, inputs of the NOR gate U975 of timing control circuit (FIG. 7) are both low. Therefore, data-write enable signal Dwen is driven high by NOR gate U975 of the timing control circuit (FIG. 7). The high Dwen signal turns on the enable transistors N754 and N761 of the write driver (FIG. 6), and thereby activating the write driver (block 1004 of FIG. 10). The state of wbret_b also causes PC_b to assert high, thereby turning off the data line equalization transistor P935 and pre-charge transistors P933 and P934 of the data amplifier (FIG. 6). The activation low of the Wbret_b signal isolates the output entry of the write buffer from the input entry by turning off the transmission gate U863 of the write buffer (FIG. 5). Later, signal Daen is activated high to turn on the data amplifier (block 1006 of FIG. 10). Signal Daen is activated high after the high state at data write enable signal Dwen propagates through the gates U977 and I922 of timing control circuit (FIG. 7) in a self-timed manner, as described earlier. The delay of the turn-on of the data amplifier ensures sufficient signal development on DI and ⁻DI(>0.1V) before the data-amplifier is tuned on. The activation of the data amplifier accelerates signal amplification on DI and ⁻DI. During the time when the write data is being established on DI and ⁻DI, sense-amplifiers in the column area of the array are enabled. Then column switches are turned on by the activation of CSx signals (block 1008 of FIG. 10). At this time the differential signal on BI and ⁻BI is still relatively small (<1V), as illustrated by the waveform annotated (1) in FIG. 8, but the differential signal on DI and ⁻DI is close to fully developed (~VCC). In the worst case, when the write data has a polarity opposite that in the bit lines, the relatively large capacitance on the data lines added to the relatively large drive provided by both the write driver and the data amplifier easily overcome the differential signal on the sense amplifier and the bit lines. In contrast, in the traditional schemes, the write buffer is activated after the column switches are turned on. As a result, under the prior art scheme, the write buffer has to overcome the relatively large signals in the data lines as well as the bit lines without the help of the data amplifier, making the writing process relatively slow.

After signal on the bit lines is fully developed and the write data signal fully established in the memory cell. The bit-line pre-charge signal PRC# is activated. The activation causes the word line Win and the sense amplifier enable signals SAn and SAp to deactivate. Subsequently, signal EQ is activated and equalizing the voltages on the bit lines to VCC/2. In the read-write circuit, the activation of the PRC# signal causes the deactivation of the Wbret_b signal which in turn deactivates the data amplifier and the write driver, and activates the Pc_b signal. The activation low of Pc_b signal turns on the data line pre-charge and equalization transistors P933, P934 and P935 of the data amplifier (FIG. 6). Thereby, the signals DI and ⁻DI are pre-charged to VCC. Thus the preparation of the read-write circuitry for another read or write cycle is completed.

Figure 11:
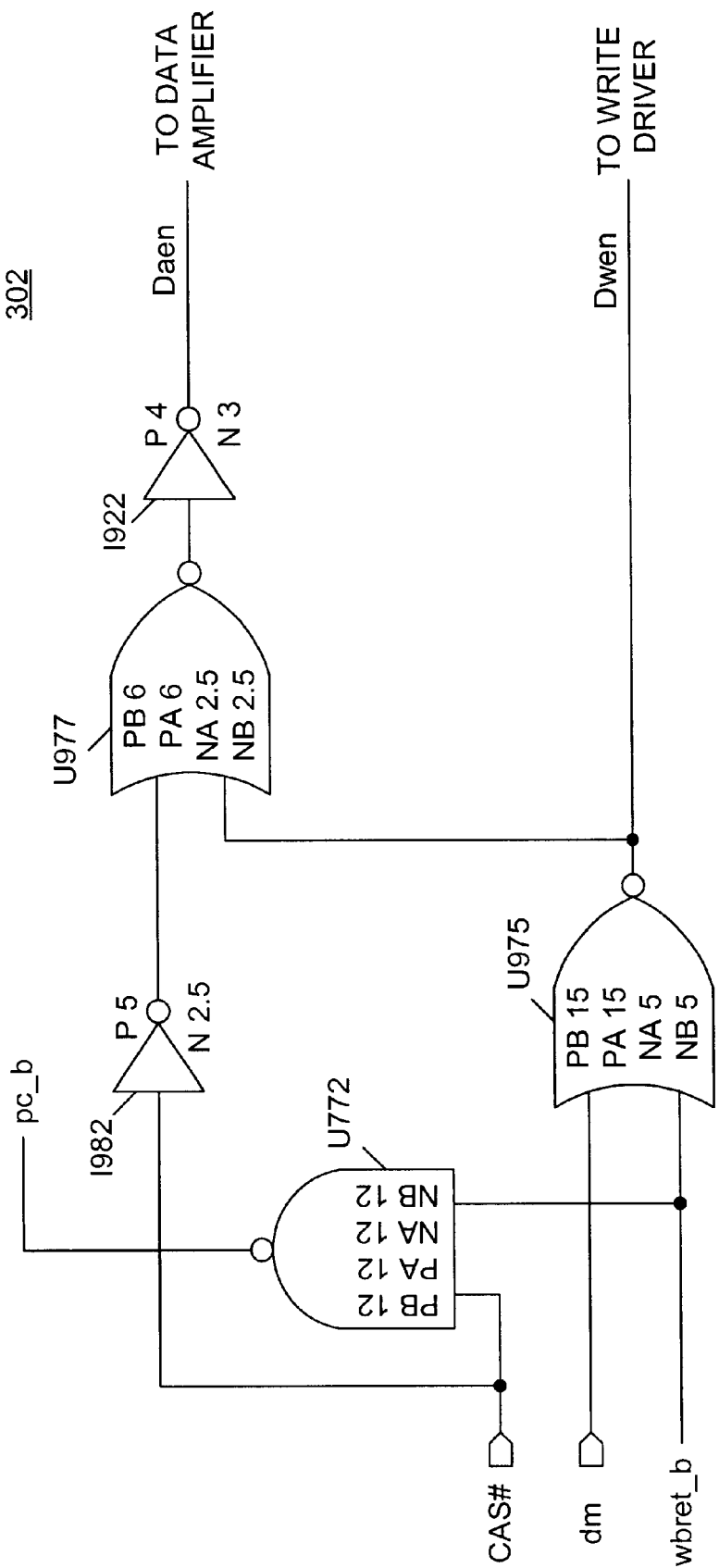
FIG. 11 illustrates the timing control circuit in accordance with an alternate embodiment.
Figure 12:
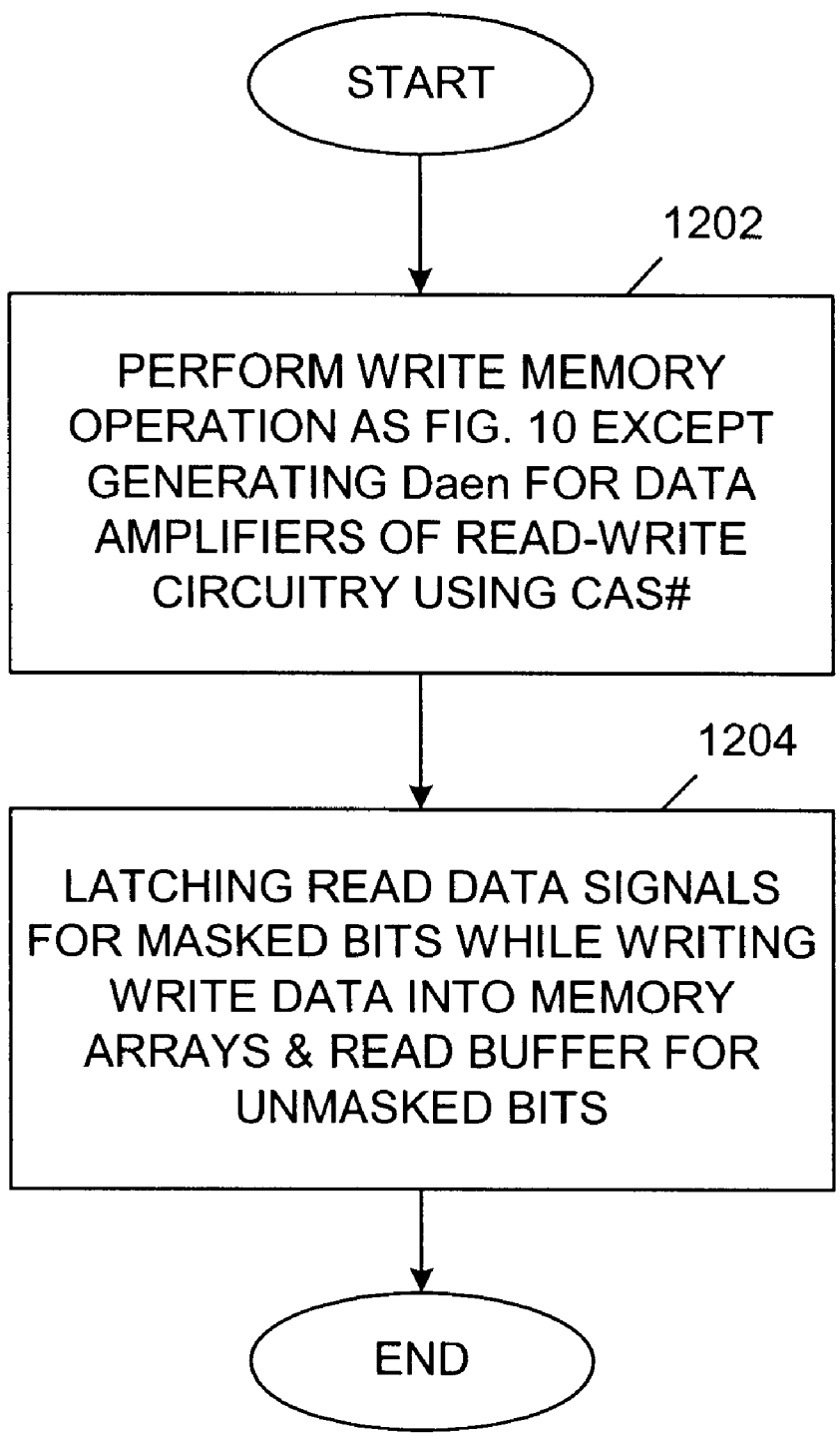
FIG. 12 illustrates a method of writing and reading data employing the alternate embodiment of FIG. 11.

Referring now to FIGS. 11–12, wherein two diagrams illustrating the timing control circuit and the memory write operation respectively, in accordance with an alternate embodiment, are shown. Under this alternate embodiment, an entire updated set of 4 words of 32 bits, which is the subject of a masked memory write operation and an immediately following memory read operation to the same address, may be made available at the end of the memory write operation, without having to make a separate read access of the memory array. Before these figures are described in detail, recall from earlier description that only the data amplifiers and the write data drivers corresponding to the non-masked data bits are activated during a memory write operation. Data amplifiers and write drivers of the masked bits are not activated. For the earlier described embodiment (FIG. 7), this is accomplished by having the data amplifier enable signal Daen dependent on the write data driver enable signal Dwen, which in turn is made dependent on the data mask signal dm. Daen is also dependent on signal read_b, which is not activated during a write cycle. For the alternate embodiment illustrated in FIG. 11, Daen is made dependent on Dwen and the memory control signal CAS#, which is activated in both memory array read and write cylces.

Thus, for the non-masked data bits, the memory write operation proceeds as described earlier. That is, once wbret_b signal is activated and dm is low, signal Dwen is driven high by NOR gate U975. The high Dwen signal turns on transistors N754 and N761 of the corresponding write drivers (FIG. 6), thereby activating these write drivers. In turn, signal development began on the corresponding DI and ⁻DI, as the write drivers are activated. During the time when write data are being developed on DI and ⁻DI, the corresponding data amplifiers are turned on, resulting in the acceleration of signal development on DI and ⁻DI. Next, sense amplifiers are enabled in the column area of the array, followed by the activation of the column switches by the activation of the CSx signals. At that time, the differential signals on BI and ⁻BI are still relatively weak (<1v), but the differential signals of the non-masked data on the corresponding DI and ⁻DI are much larger (~2–3v). The non-masked write data overcome the differential signals on the bit lines, resulting in their eventual storage into the memory array. (Block 1202 of FIG. 12.) By virtue of the fact that the read data buffer operates responsive to the voltage state of data lines DI and ⁻DI, these non-masked write data are also latched into the read data buffer.

Meanwhile, for the masked data bits, while their data amplifiers are not activated, the corresponding DI and ⁻DI remain at the potential close to Vcc. However, once the CAS# signal is activated, PC_b is deactivated, resulting in the equalization transistor P935 and pre-charge transistors P933 and P934 of the data amplifier (FIG. 6) being disabled. Coupled that with the subsequent turning on of the column switches, read data signals begin to develop on these DI and ⁻DI. The activation of CAS# subsequently activates the Daen signal and thus the data amplifier, thereby accelerating the development of the read data signals. Eventually, that led to their storage in the read buffer, when the corresponding portion of the input stage of the read buffer couples the corresponding portion of regenerative latch of the read buffer to these DI and ⁻DI. (Block 1204 of FIG. 12).

Thus, at the end of the write memory array operation, both the non-updated portion and the updated portion of the 4-word set can be found in the read data buffer. Therefore, if the entire 4-word set is the subject of the immediately following read operation, the read operation may be immediately satisfied by gating data out directly from the read data buffer without having to make a separate access of the memory array. This data merge operation is advantageous also when a read operation hits the write buffer. When the write buffer hit is detected, a memory write operation can be generated to retire the write data to the memory array, and at the same time obtains the correct read data for output.

Those skilled in the art will recognize that the present invention is not limited by the details described, instead, the present invention can be practiced with modifications and alterations within the spirit and scope of the appended claims. The description is thus to be regarded as illustrative instead of restrictive on the present invention.

Thus, high speed read-write circuitry for semi-conductor memory device has been described.

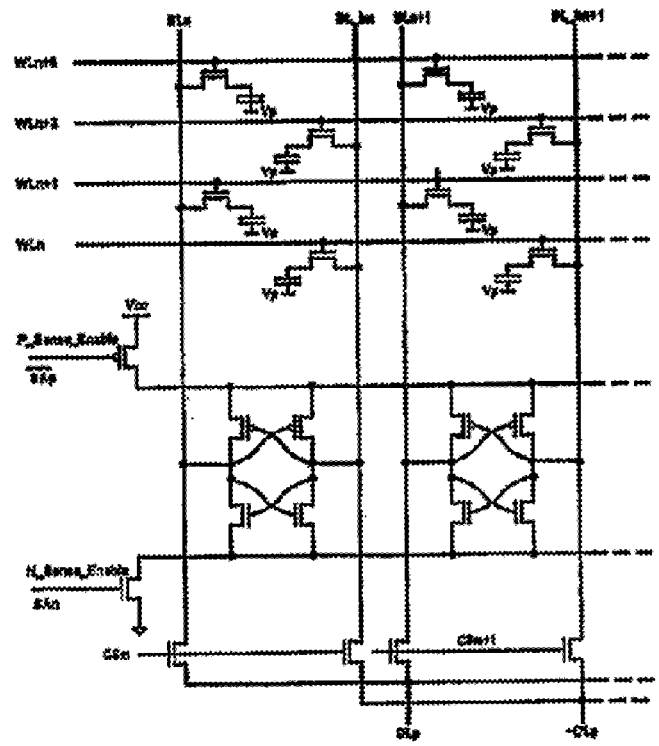

What is claimed is:

1. A read buffer for use in a semi-conductor memory device comprising:
    a plurality of inverters coupled to each other to form a regenerative latch; and
    a plurality of transistors coupled to the inverters and to data lines of the semi-conductor memory device to isolate the inverters from the data lines when the data lines are in a pre-charged state.

2. A semi-conductor memory device comprising:
    a plurality of data lines;
    a data amplifier coupled to the data lines to pre-charge the data lines and maintain voltage equalization on the data lines while the data amplifier is deactivated, and to amplify data signals on the data lines while the data amplifier is activated; and
    a read buffer coupled to the data lines, including an input stage and a regenerative latch, wherein the input stage isolates the regenerative latch from the data lines when the data lines are in a pre-charged state.

3. The semi-conductor memory device of claim 2, wherein
    the regenerative latch comprises a plurality of inverters; and
    the input stage comprises a plurality of transistors coupled to the inverters and to the data lines, the transistors entering an off-state responsive to the data lines being in a pre-charged state.

4. A method for reading data from a memory array of a semi-conductor memory device comprising:
    activating a plurality of sense amplifiers coupled to a plurality of memory cells by a corresponding plurality of bit line pairs, whereby the plurality of sense amplifiers start to amplify read data signals on the plurality of bit line pairs; then
    activating a subset of a plurality of column switches coupled to the plurality of bit line pairs, wherein the subset of column switches couples a subset of the bit line pairs to a set of data line pairs; and then
    activating a set of regenerative data amplifiers coupled to the set of data line pairs to amplify read data signals on the set of data line pairs and the subset of the bit line pairs, wherein the regenerative data amplifiers are enabled before the sense amplifiers fully amplify the read data signals.

5. The method of claim 4 further comprising storing data signals representative of the read data signals in a set of regenerative latches of a read buffer, wherein each of the regenerative latches is coupled to a corresponding data line pair.

6. A semi-conductor memory device comprising:
    a memory array to store data;
    a write buffer coupled to the memory array to temporarily store write data to be written into the memory array;
    a read buffer coupled to the memory array and to the write buffer to temporarily store read data being read out of the memory array or write data being driven out of the write buffer; and
    circuitry coupled to the memory array, the write buffer and the read buffer to read a masked portion of a set of data out from the memory array into the read buffer while writing a non-masked portion of the set of data from the write buffer into the memory array and the read buffer during the same memory array operation.

7. The semi-conductor memory device of claim 6, wherein the circuitry includes read-write circuitry having a plurality of data amplifiers that are activated during memory write operation, independent of masking, to either accelerate amplification of write data being written from the write buffer into the memory array or accelerate amplification of read data being read out of the memory array into the read buffer.

8. The semi-conductor memory device of claim 7, wherein the circuitry further includes timing control circuitry coupled to the read-write circuitry to activate the data amplifiers in a self-timed manner.

9. A method for operating a semi-conductor memory device comprising:
    writing an unmasked portion of a plurality of data bits into a memory array and a read buffer of the semi-conductor memory device during a write memory array operation; and
    concurrently reading a masked portion of the plurality of data bits from the memory array into the read buffer during the same write memory array operation.

10. The method of claim 9, wherein the writing and the concurrently reading operations are performed responsive to a read operation hitting a write buffer containing said unmasked portion of the plurality of data bits.

11. The method of claim 5, wherein the step of storing data signals comprises applying each of the read data signals to an associated input stage, wherein each input stage couples an associated regenerative latch to a first power supply terminal if the associated read data signal has a first logic state, and wherein each input stage couples the associated regenerative latch to a second power supply terminal if the associated read data signal has a second logic state.

* * * * *

UNITED STATES PATENT AND TRADEMARK OFFICE
CERTIFICATE OF CORRECTION

| | |
|---|---|
| PATENT NO. | : 6,714,470 B2 |
| APPLICATION NO. | : 09/963984 |
| DATED | : March 30, 2004 |
| INVENTOR(S) | : Wingyu Leung et al. |

It is certified that error appears in the above-identified patent and that said Letters Patent is hereby corrected as shown below:

Title Page
(57)    ABSTRACT    Line 8, replace "activatedin" with --activated in--.

Column 1, line 40, replace "Matix" with --Matrix--.

Column 1, line 63, replace "P_sense-" with --P_Sense_--.

Column 4, line 23, delete "115 is divided into 16 banks of 128 rows and 2048 columns."

Column 4, line 31, replace "owed" with --owned--.

Column 4, line 33, replace "DRAN" with --DRAM--.

Column 6, line 18, replace "resolved" with --resolve--.

Column 8, line 46, replace "sense-ampliffier" with --sense-amplifier--.

Column 10, line 14, replace "cylces" with --cycles--.

UNITED STATES PATENT AND TRADEMARK OFFICE
CERTIFICATE OF CORRECTION

PATENT NO. : 6,714,470 B2
APPLICATION NO. : 09/963984
DATED : March 30, 2004
INVENTOR(S) : Wingyu Leung et al.

Page 2 of 2

Figure 1:
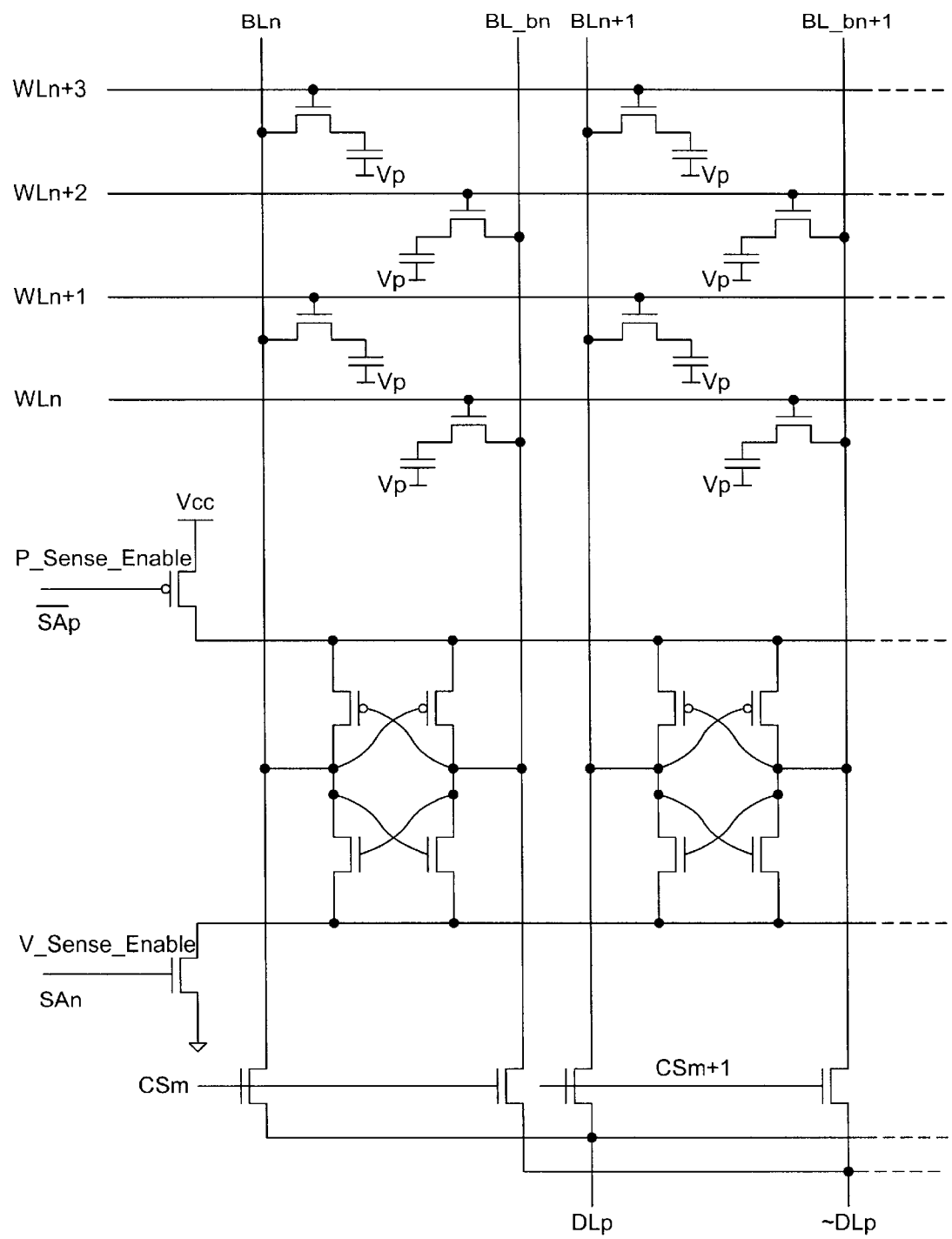
FIG. 1 illustrates a prior art array of memory cells in accordance with one embodiment.

It is certified that error appears in the above-identified patent and that said Letters Patent is hereby corrected as shown below:

In The Drawings, In Fig. 1 of the drawings, "V_Sense_Enable" should be replaced with --N_Sense_Enable--.

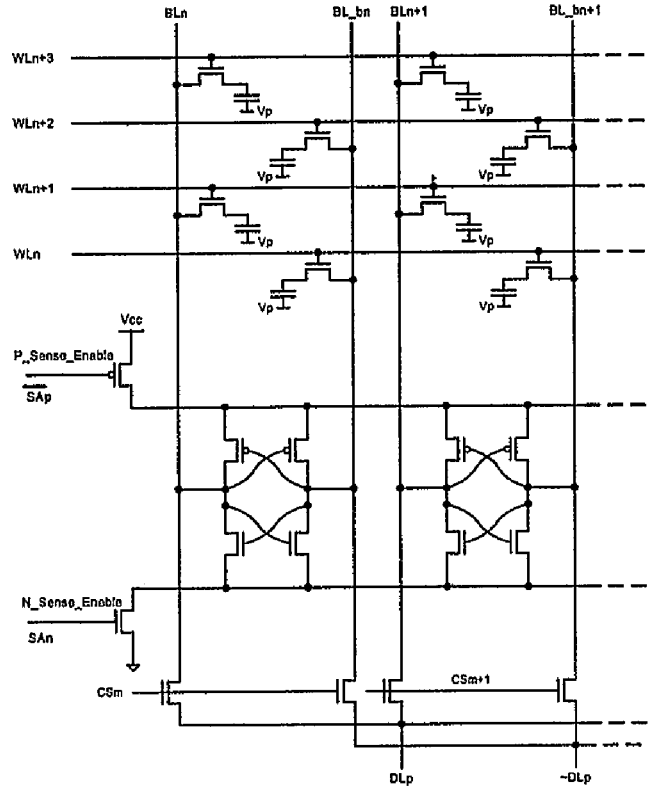

Fig. 1

Signed and Sealed this

Twenty-fifth Day of September, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,714,470 B2 | Page 1 of 4 |
| APPLICATION NO. | : 09/963984 | |
| DATED | : March 30, 2004 | |
| INVENTOR(S) | : Wingyu Leung et al. | |

It is certified that error appears in the above-identified patent and that said Letters Patent is hereby corrected as shown below:

Delete title page and substitute therefore the attached title page.

Title Page
(57) ABSTRACT  Line 8, replace "activatedin" with --activated in--.

Column 1, line 40, replace "Matix" with --Matrix--.

Column 1, line 63, replace "P_sense-" with --P_Sense_--.

Column 4, line 23, delete "115 is divided into 16 banks of 128 rows and 2048 columns."

Column 4, line 31, replace "owed" with --owned--.

Column 4, line 33, replace "DRAN" with --DRAM--.

Column 6, line 18, replace "resolved" with --resolve--.

Column 8, line 46, replace "sense-ampliffier" with --sense-amplifier--.

Column 10, line 14, replace "cylces" with --cycles--.

UNITED STATES PATENT AND TRADEMARK OFFICE
CERTIFICATE OF CORRECTION

PATENT NO.        : 6,714,470 B2                                    Page 2 of 4
APPLICATION NO.   : 09/963984
DATED             : March 30, 2004
INVENTOR(S)       : Wingyu Leung et al.

It is certified that error appears in the above-identified patent and that said Letters Patent is hereby corrected as shown below:

In The Drawings, In Fig. 1 of the drawings, "V_Sense_Enable" should be replaced with --N_Sense_Enable--.

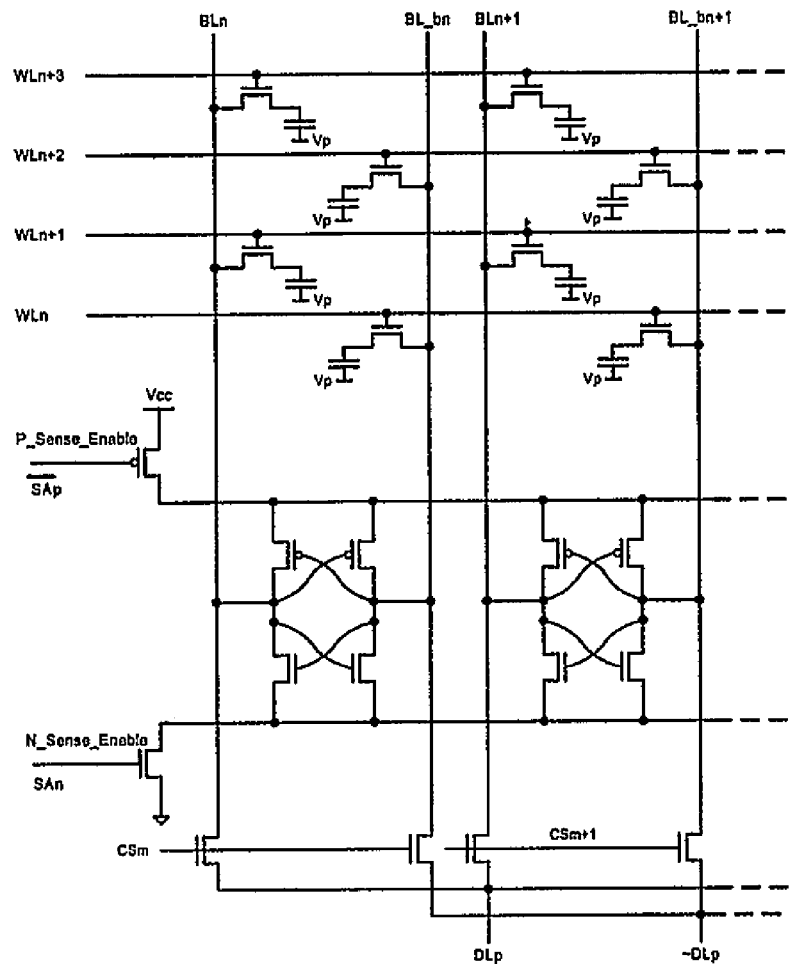

Fig. 1

UNITED STATES PATENT AND TRADEMARK OFFICE
CERTIFICATE OF CORRECTION

PATENT NO.       : 6,714,470 B2  Page 3 of 4
APPLICATION NO.  : 09/963984
DATED            : March 30, 2004
INVENTOR(S)      : Wingyu Leung et al.

It is certified that error appears in the above-identified patent and that said Letters Patent is hereby corrected as shown below:

This certificate supersedes Certificate of Correction issued September 25, 2007.

Signed and Sealed this

Twenty-seventh Day of November, 2007

JON W. DUDAS
*Director of the United States Patent and Trademark Office*

United States Patent
Leung et al.

(10) Patent No.: US 6,714,470 B2
(45) Date of Patent: Mar. 30, 2004

(54) HIGH-SPEED READ-WRITE CIRCUITRY FOR SEMI-CONDUCTOR MEMORY DEVICES

(75) Inventors: Wingyu Leung, Cupertino, CA (US); Jui-Pin Tang, San Jose, CA (US)

(73) Assignee: Monolithic System Technology, Inc., Sunnyvale, CA (US)

(*) Notice: Subject to any disclaimer, the term of this patent is extended or adjusted under 35 U.S.C. 154(b) by 0 days.

(21) Appl. No.: 09/963,984

(22) Filed: Sep. 25, 2001

(65) Prior Publication Data

US 2002/0015344 A1 Feb. 7, 2002

Related U.S. Application Data

(62) Division of application No. 09/267,228, filed on Mar. 12, 1999.

(51) Int. Cl.$^7$ .................................................. G11C 7/00
(52) U.S. Cl. ................. 365/203; 365/189.05; 365/206; 365/207
(58) Field of Search ......................... 365/203, 189.05, 365/206, 207, 208

(56) References Cited

U.S. PATENT DOCUMENTS

| | | | | |
|---|---|---|---|---|
| 4,811,300 A | * | 3/1989 | Lanfranca | 365/203 |
| 4,961,166 A | * | 10/1990 | Sato et al. | 365/189.01 |
| 4,984,204 A | * | 1/1991 | Sato et al. | 365/189.11 |
| 5,361,229 A | * | 11/1994 | Chiang et al. | 365/189.05 |
| 6,018,253 A | * | 1/2000 | Wendell | 326/93 |
| 6,310,808 B1 | * | 10/2001 | Tanizaki | 365/203 |
| 6,320,806 B1 | * | 11/2001 | Han | 365/203 |

* cited by examiner

*Primary Examiner*—Son T. Dinh
(74) *Attorney, Agent, or Firm*—Bever, Hoffman & Harms, LLP; E. Eric Hoffman

(57) ABSTRACT

A semi-conductor memory device having a wide write data bandwidth is provided with high speed read-write circuitry having data amplifiers that are activated to accelerate amplification of write data signals being driven by write data drivers onto data lines of the cell array of the device during memory write cycles, as well as activated to amplify read data signals on the data lines during memory read cycles. Moreover, the data amplifiers are activated in a self-timed manner. In one embodiment, the device is further provided with a read data buffer that is constituted with a regenerative latch and an input stage, and a write data buffer having multiple entries. The input stage of the read data buffer isolates or couples the regenerative latch to the data lines depending on whether the data lines are in a pre-charged state or not. In one embodiment, the data amplifiers and the write drivers are further arranged to enable write data in the write buffer to be merged with the masked read data from the memory array when a read transaction hits the write buffer.

11 Claims, 10 Drawing Sheets